United States Patent [19]

Yanagi et al.

[11] Patent Number: 5,461,323

[45] Date of Patent: Oct. 24, 1995

[54] METHOD AND APPARATUS OF TESTING BOTH SURFACES OF PRINTED CIRCUIT BOARD SIMULTANEOUSLY

[75] Inventors: Kunio Yanagi; Touji Nakazawa, both of Sagamihara, Japan

[73] Assignee: Tescon Co., Ltd., Kangawa, Japan

[21] Appl. No.: 155,757

[22] Filed: Nov. 23, 1993

[30] Foreign Application Priority Data

| Dec. 18, 1992 | [JP] | Japan | 4-338530 |
| Mar. 3, 1993 | [JP] | Japan | 5-042548 |
| Mar. 8, 1993 | [JP] | Japan | 5-009424 U |
| Apr. 22, 1993 | [JP] | Japan | 5-021056 U |

[51] Int. Cl.$^6$ ............................. G01R 1/04; H01R 9/09
[52] U.S. Cl. ............................. 324/754; 324/755
[58] Field of Search ..................... 324/750, 754, 324/755, 761, 158.1, 73.1; 438/8; 439/482, 824; 269/71, 73

[56] References Cited

U.S. PATENT DOCUMENTS

| 4,818,933 | 4/1989 | Kerschner et al. | 324/754 |
| 5,107,206 | 4/1992 | Yanagi et al. | 324/754 |
| 5,153,504 | 10/1992 | Bonnet et al. | 324/754 |
| 5,214,374 | 5/1993 | St. Onge | 324/754 |

*Primary Examiner*—Vinh P. Nguyen
*Attorney, Agent, or Firm*—Nikaido Marmelstein Murray & Oram

[57] ABSTRACT

Disclosed are improved method and apparatus for testing printed circuit board in which method and apparatus a selected printed circuit board is stretched to be unbent, thus permitting measuring probes to come to contact to selected points on the printed circuit board exactly for measuring, thus preventing undesired deviations of selected measuring points caused by the bending of the printed circuit board in hitting selected measuring points by probes. The printed circuit board tester includes a pair of clamps for gripping the opposite lateral edges of the printed circuit board standing upright; a drive devices for driving the clamps close to or apart from each other; and stretch control device between the drive devices and one of the clamps for applying a controlled stretch to the printed circuit board.

8 Claims, 9 Drawing Sheets

METHOD AND APPARATUS OF TESTING BOTH SURFACES OF PRINTED CIRCUIT BOARD SIMULTANEOUSLY

BACKGROUND OF THE INVENTION

1. Field of the Invention

The present invention relates to a method of testing a printed circuit board not yet mounted electrical circuit elements or a printed circuit board already mounted circuit elements as to whether there are defective circuit breaks; whether there are required integrated circuits, resistors, capacitors or other electrical circuit elements in position; and whether these circuit elements function well, and to a printed circuit board tester using such method.

2. Description of Related Art

The printed circuit board testing method and apparatus required the selection and use of jigs exclusively designed for different printed circuit boards to test and make a decision as to which printed circuit boards should be passed or rejected. Recently an improved tester has been proposed in which measuring probes are moved laterally and longitudinally on one of the opposite major surfaces of a printed circuit board to be tested under the control of a microcomputer, thereby permitting the measuring probes to be in contact with selected measuring points one after another according to a measuring program (U.S. Pat. No. 5,107,206). This tester can be used advantageously in testing different printed circuit boards without requiring jigs.

In use a printed circuit board is fixed in position in the tester, and then a plurality of measuring probes are put selected measuring points to provide electric signals. These electric signals are measured and processed with the aid of meters and microcomputers to make a decision as to the printed circuit board should be rejected or passed.

In fixing a selected printed circuit board in position the reference apertures of the printed circuit board are put in registration with the reference pins of a printed circuit board setting frame, and then the printed circuit board thus put in correct position are gripped and fixed by its opposite edges. Another tester uses a matrix of measuring probes on which one major surface of a selected printed circuit board is put by applying a negative pressure thereto for testing.

In these conventional printed circuit board testers a printed circuit board to be tested is fixed simply by gripping its opposite edges, and the printed board cannot be unbent if it is bent.

The bending of the printed circuit board is likely to increase with the increase of the printed circuit board size. With such bending of the printed circuit board and with the increased density of circuit elements per unit area in the printed circuit board (and accordingly caused undesired deviations of selected measuring points), the measuring probe cannot come to touch selected measuring points. In fact, the measuring probe often fails to hit exactly the right point but come close to it, or hit a wrong point adjacent to the right one.

As for the method of applying one major surface of a selected printed circuit board to a matrix of measuring probes under negative pressure, the printed circuit board can be unbent to a straight posture, but disadvantageously the simultaneous testing of the opposite major surfaces of the printed circuit board is not permitted, accordingly lowering the measuring efficiency. Still disadvantageously, the negative pressure applying unit is rather bulky and complex in structure, accordingly the manufacturing cost increases.

As a recent tendency printed circuit boards are equipped with parts and elements at an ever increasing density, and the conventional method cannot be used in testing such high-density printed circuit boards.

SUMMARY OF THE INVENTION

In view of the above one object of the present invention is to provide a method of testing printed circuit boards which method permits the simultaneous testing of the opposite major surfaces of a selected printed circuit board, guaranteed free of undesired deviations of selected measuring points caused by the bending of the printed circuit board in hitting selected measuring points by probes.

Another object of the present invention is to provide a printed circuit board tester which is guaranteed free of undesired deviations of selected measuring points caused by the bending of a printed circuit board in hitting selected measuring points of the opposite major surfaces of the printed circuit board by probes.

Still another object of the present invention is to provide a printed circuit board tester having means to permit a fine adjustment of stretch applied to a selected printed circuit board for unbending.

Still another object of the present invention is to provide a printed circuit board tester which permits testing of printed circuit boards of different thicknesses.

Still another object of the present invention is to provide a printed circuit board tester which permits gripping of a selected printed circuit board with an increased force in spite of its simple structure.

To attain these objects a method of testing printed circuit boards according to the present invention comprises steps of: holding a printed circuit board by gripping the opposite edges with two grippers; applying a stretch to the printed circuit board by the grippers to unbend the printed circuit board; and effecting a desired test on the printed circuit board. With this method undesired deviations of selected measuring points relative to the measuring probe can be reduced, and therefore, it is assured that the measuring probe can hit exactly the right measuring points one after another, accordingly improving the accuracy with which necessary measurings are effected.

A required testing may be effected with the printed circuit board held vertically or longitudinally, thus facilitating the simultaneous measuring of the opposite major surfaces of a selected printed circuit board, and also permitting a programmer to see each major surface of the printed circuit board when preparing programs by hitting selected measuring points one after another by a probe pin. This is very advantageous to programming.

Printed circuit board tester according to the present invention comprises: a printed circuit board holder for fixing and holding a printed circuit board at a reference position; and at least one measuring probe movable in longitudinal and lateral directions with each surface of the printed circuit board which is held at the reference position, said measuring probe being capable of moving to a selected measuring point on the circuit board to test if there is any break in the circuit of the board; if there are necessary parts in the board; or if such parts function well, characterized in that: said holder has a pair of clamps for gripping the opposite lateral edges of the printed circuit board holding longitudinally; drive means for driving the clamps close to or apart from each other; and stretch control means between the drive means and one of the clamps for applying a controlled stretch to the printed circuit board.

With this arrangement the printed circuit board can be stretched longitudinally with a controlled force, thereby permitting the unbending of the printed circuit board without damaging the same. The simultaneous measuring of the opposite major surfaces of the stretched printed circuit board can be effected by measuring probes which are arranged on either side of the printed circuit board.

The stretch control means may have means for detecting inadequate gripping of the printed circuit board with the clamps. The detecting means may comprise a detecting sensor and a light blocking plate or shutter to prevent the light from falling on the detecting sensor. The shutter and the detecting sensor are so placed that the shutter is responsive to the failure of gripping a printed circuit board by the clamps for permitting the light to fall on the sensor, thereby causing an associated control means to prevent the drive means and the stretch control means from applying additional stretch to the clamps.

The pair of clamps may be arranged longitudinally in the opposing relation, and the upper clamp may be fixed to a movable, lateral beam which is adapted to move vertically or longitudinally by the drive means. This arrangement has the effect of reducing the complication in structure and improving the workability of the printed circuit board tester.

The drive means may comprise a pair of longitudinal threaded rods, a pair of guide rails each extending parallel to the associated longitudinal threaded rod, a servo motor operatively connected to one of the longitudinal threaded rods, rotary transmission means for rotating the pair of longitudinal threaded rods in unison, and drive blocks slidably fixed to the guide rails for moving up and down, and the stretch control means may be positioned between each drive means and the movable, lateral beam. This arrangement assures that the upper clamp can move up and down exactly.

The stretch control means for permitting application of a controlled stretch to a selected printed circuit board via the clamps may be positioned at each end of the movable, lateral beam. It may comprise a resilient member such as a coiled spring positioned between the drive block and a guide block which is slidable along the guide rail, and an adjusting bolt for permitting the adjusting of the distance between the guide block and the drive block. It is required that the stretch to be applied to a printed circuit board be controlled in consideration of the thickness, material and physical shape of the printed circuit board. The required control can be attained in terms of the compression amount of the coiled spring. The computer-aided control means for controlling servo motor, air cylinders and other mechanical parts according to the testing program may adjust the setting of the clamps in terms of the longitudinal dimension of the printed circuit board. Specifically the computer-aided control means may control the displacing and positioning of the drive block relative to the guide block of the stretch control means so as to permit the coiled spring to cause the effect of generating a desired stretch because such a stretch can be controlled in terms of the compression amount of the coiled spring, which varies with the distance set between the drive block and the guide block.

Each clamp may have a pair of nails for gripping one or the other lateral edge of the printed circuit board. One of these nails may be adjustably movable in the direction of the printed circuit board thickness, thereby permitting application of a predetermined pushing force to the printed circuit board regardless of the thickness of the printed circuit board.

Alternatively each clamp may have means for applying a negative pressure to the printed circuit board for holding the same. The sucking plane of the negative pressure applying means may be placed coextensive with the gripping plane of the nail which is movable in the direction of the printed circuit board thickness. Thanks to such sucking means the inter-nail distance need not be readjusted even if another printed circuit board of different thickness is put in position for testing, assuring that a predetermined pressure is applied to the printed circuit board all the time. As no readjustment is required, required testing can be effected at an increased efficiency. Also, this arrangement has the effect of improving the reliability of the printed circuit board tester.

Other objects and advantages of the present invention will be understood from the following description of a printed circuit board tester according to a preferred embodiment of the present invention, which is shown in accompanying drawings.

DESCRIPTION OF THE PREFERRED EMBODIMENTS

Figure 1:
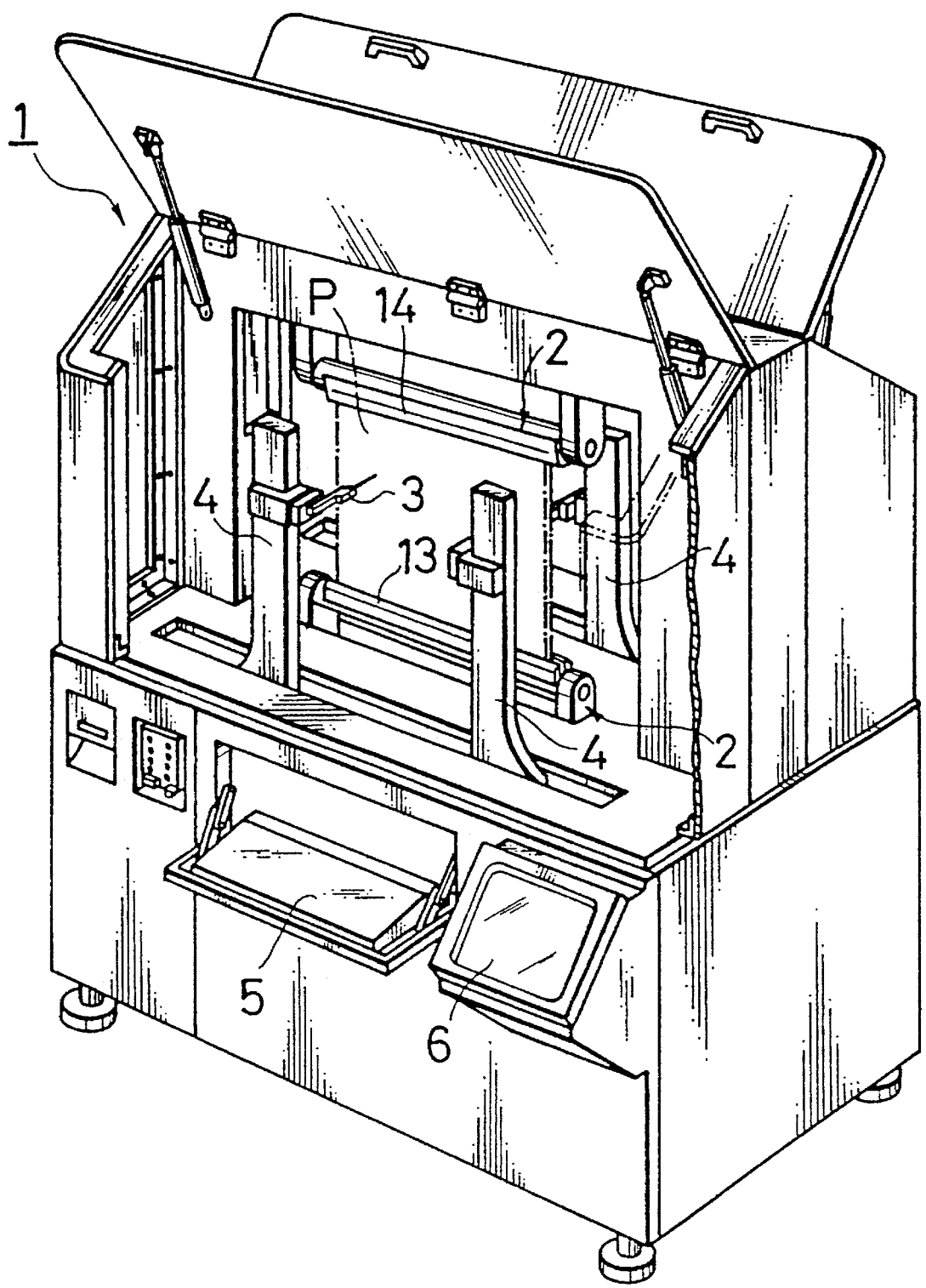
FIG. 1 is a perspective view of the printed circuit board tester, partly broken.

Referring to FIG. 1, a printed circuit board tester according to the present invention 1 comprises a printed circuit board holder 2 for fixing and holding a printed circuit board vertically or longitudinally with the upper and lower lateral edges of the printed circuit board P gripped by upper and lower clamps 14 and 13, measuring probes 3 movable in longitudinal and lateral directions in each surface of the printed circuit board P standing upright, an operating keyboard 5 and a display 6 showing measuring values, decisions as to printed circuit boards should be passed or rejected and other measuring results.

Figure 2:
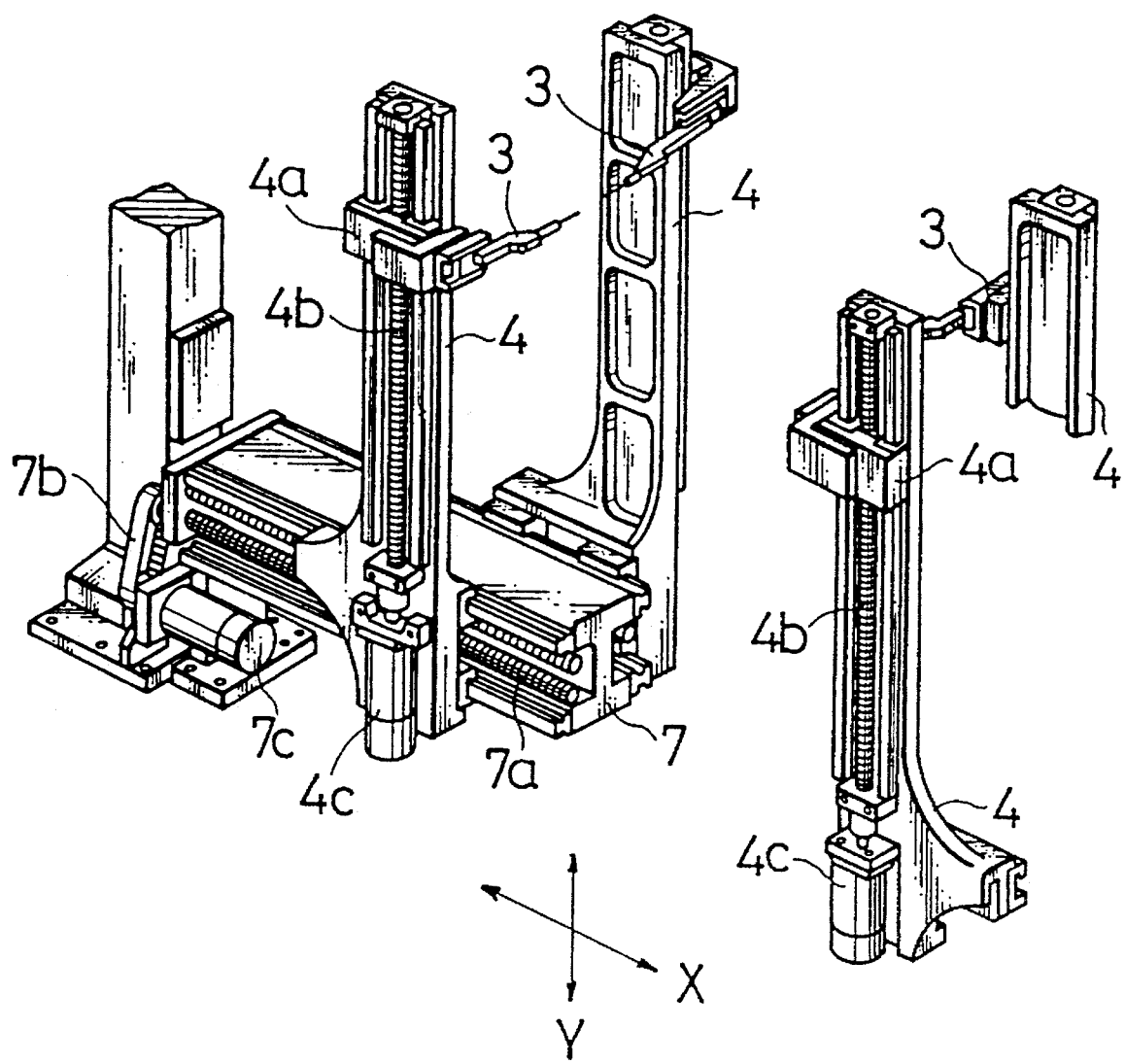
FIG. 2 is a perspective view of drive means and measuring probes.

The measuring probes 3 are arranged on the opposite major surfaces of the printed circuit board P standing upright to be tested as seen from FIG. 2. Specifically, the measuring probes 3 are slidably attached to Y-axis poles 4 by drive pieces 4a, which are driven up and down by rotating associated threaded rods 4b by associated servo motors 4c. As shown in FIG. 2, each Y-axis pole is supported at its lower end by an X-axis beam 7 so that it may be driven laterally by rotating associated threaded rods 7a by associated timing belts 7b and servo motors 7c. Two Y-axis poles 4 are arranged on the X-axis beam 7 to face one of the opposite major surfaces of the printed circuit board P to be tested, and another two Y-axis poles 4 are arranged on the X-axis beam 7 to face the other major surface of the printed circuit board P.

Figure 3:
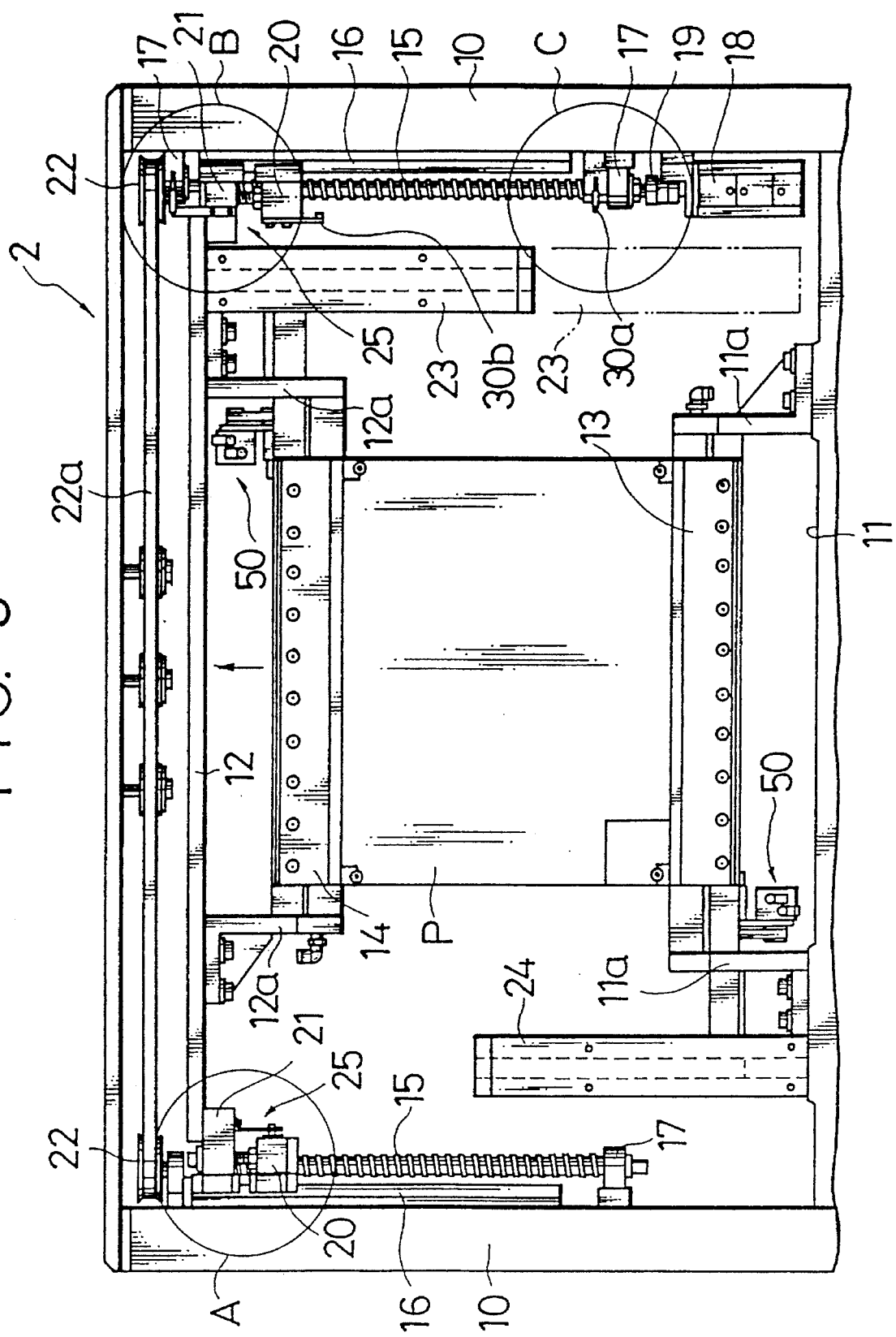
FIG. 3 is a front view of a printed circuit board holder partly omitted.

As shown in FIG. 3, the printed circuit board holder 2 comprises a base 11, two opposite guide poles 10, 10 standing upright from the opposite ends of the base 11 and a lateral beam 12 movably fixed to the opposite guide poles 10, 10. A lower clamp 13 is fixed to the base 11 via supporting brackets 11a while an upper clamp 14 is fixed to the movable beam 12 via supporting brackets 12a.

The movable, lateral beam 12 is driven up and down by rotating associated threaded rods 15, 15 journaled by upper and lower bearings 17, 17, which are fixed to the inner surfaces of the guide poles 10, 10.

As shown in FIG. 3, drive blocks 20, 20 are attached to the tops of the opposite threaded rods 15, 15, and these drive blocks 20, 20 are slidably fixed to the opposite guide rails 16, 16, which are fixed to the inner surfaces of the guide poles 10, 10, extending parallel to the threaded rods 15. Also, a guide block 21 is slidably fixed to the guide rail 16 just above each drive block 20 with a coiled spring 22 between the drive and guide blocks 20 and 21. The movable, lateral beam 12 fixed to the opposite guide blocks 21, 21. A servo motor 18 is connected to the lower end of the right threaded rod 15 via a coupling 19. The opposite threaded rods 15, 15 are connected to each other by a transmission which is composed of pulleys 22b, 22b, an endless belt 22a and other parts.

Rotation of the right threaded rod 15 by the servo motor 18 is transmitted to the left threaded rod 15 via the transmission, thus moving the opposite drive and guide blocks 20, 20 and 21, 21 up and down along the opposite guide rails 16 to move the lateral beam 12 accordingly. A safety stopper 23 suspending from the lateral beam 12 and another safety stopper 24 standing upright on the base 11 make the lateral beam 12 to stop when it continues descending below a predetermined level.

Stretch control means 25 functioning as unbending means is a rising-and-descending unit for the lateral beam 2, comprising a drive guide block 20, a guide block 21 and a coiled spring 22 between the drive and guide blocks 20 and 21 (see encircled parts A and B in FIG. 3).

Figure 4:
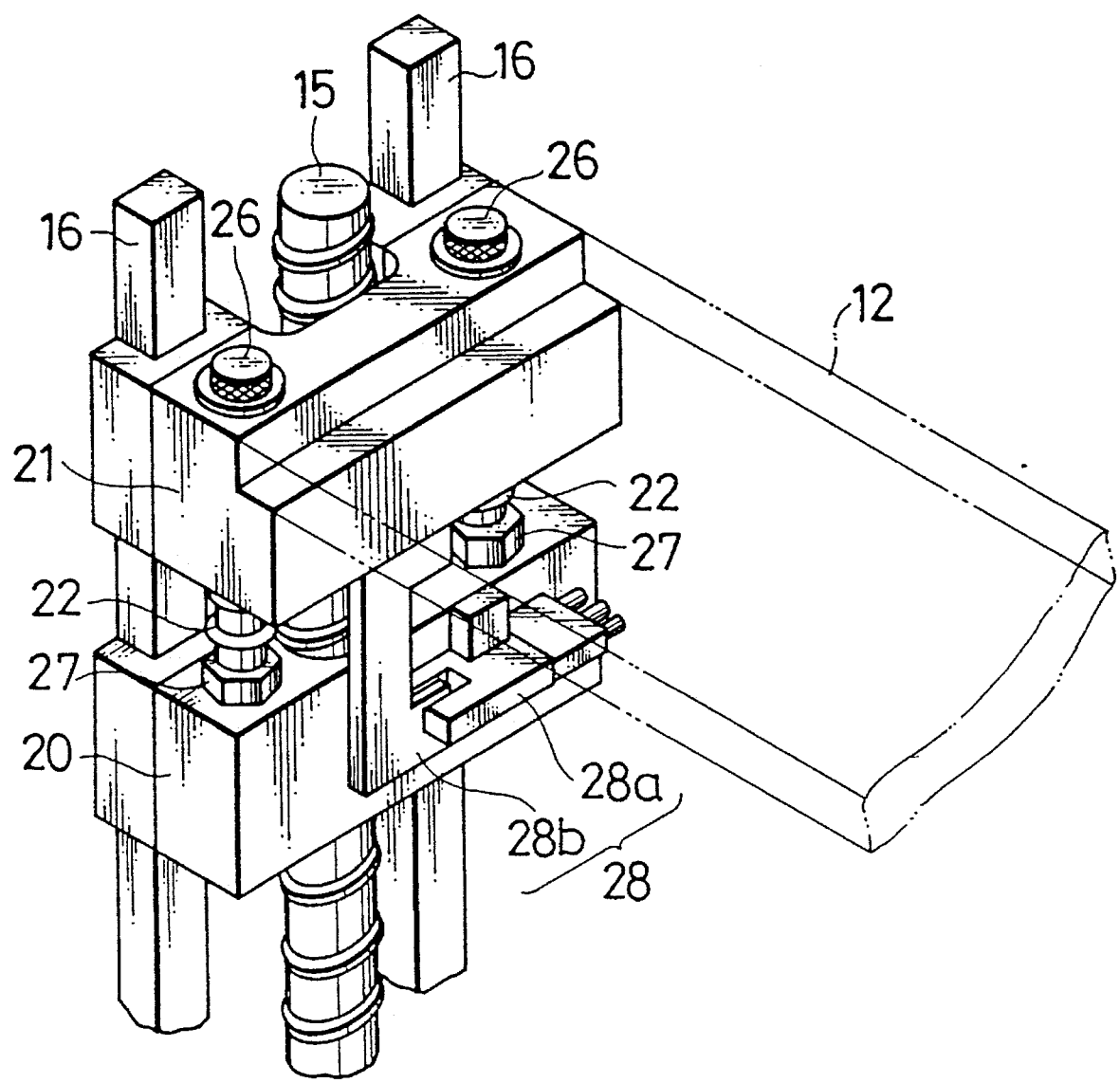
FIG. 4 is an enlarged perspective view of stretch control means.
Figure 5:
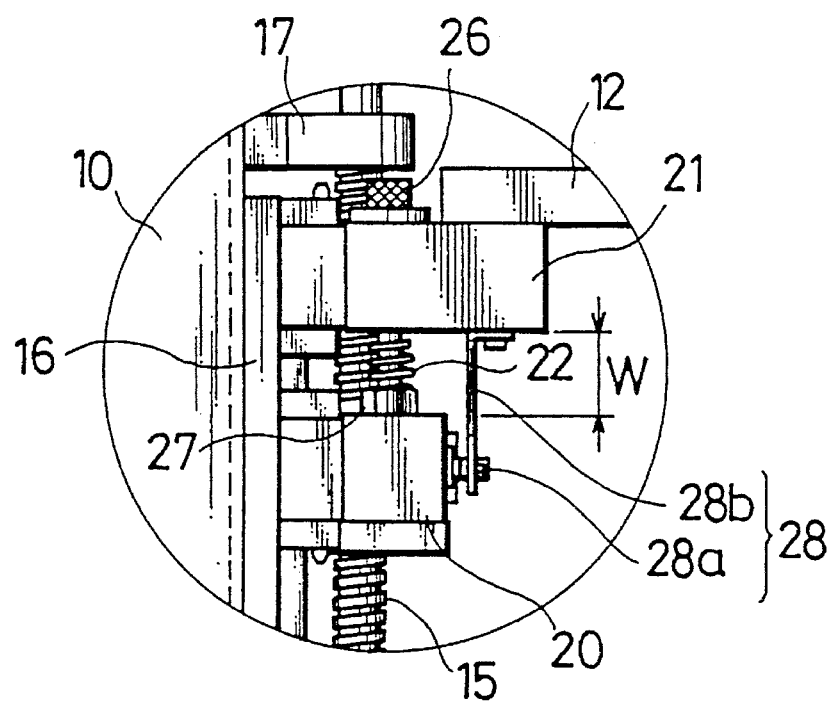
FIG. 5 is an enlarged front view of the encircled part "A" in FIG. 3.

As shown in FIG. 4, the drive block 20 has two adjusting bolts 26 threadedly engaged and fixed to its upper surface, and these adjusting bolts 26 are freely inserted in the through holes of the guide block 21. A coiled spring 22 is around each adjusting bolt 26 between the upper guide block 21 and the lower drive block 20 to urge the guide block 21 upward. A lock nut 27 engages each adjusting bolt 26 on the drive block 20. Fastening or loosing of the lock nuts 27, 27 permits the adjusting of the distance between the drive block 20 and the guide block 21, and hence the resilient force applied to the guide block 21. Usually the inter-block distance is about 30 mm.

The left stretch controller 25 is equipped with a gripping failure detector 28, which comprises a sensor 28a and a light-blocking plate 28b. The gripping failure detector 28 remains in inoperative position in which the light-blocking plate 28b prevents the light from falling on the sensor 28a for the interblock distance W of 30 mm, which represents application of no stretch to the printed circuit board P.

The printed circuit board P is gripped by its opposite lateral edges with the stationary clamp 13 and the movable clamp 14, and then the threaded rod 15 is rotated a predetermined turns by driving the servo motor 18 under the control of the control means to raise the drive blocks 20, 20. The guide blocks 21, 21 which are integrally connected to the movable clamp 14 via the movable, lateral beam 12, cannot be raised immediately, thus allowing the drive blocks 20, 20 and the associated adjusting bolts 26, 26 to rise, accordingly compressing the coiled springs 22, 22. Then, the compressed coiled springs 22, 22 push gradually up the movable clamp 14 via the guide blocks 21, 21 and the movable, lateral beam 12, thus applying a stretching force to the printed circuit board P to unbend the same into the straight posture.

Assume that the clamps 13 and 14 fail to grip the opposite lateral edges of the printed circuit board P, thus releasing the printed circuit board P. Then, on the left side of the printed circuit board tester the guide block 21 is pushed up by the coiled spring 22, thus rising until its upper surface has struck against the under surface of the head of the adjusting bolt 26. Then, the light-blocking plate 28b prevents the light from falling on the sensor 28a, stopping the testing of the printed circuit board P by the measuring probes 3 via the control means tentatively.

Figure 6:
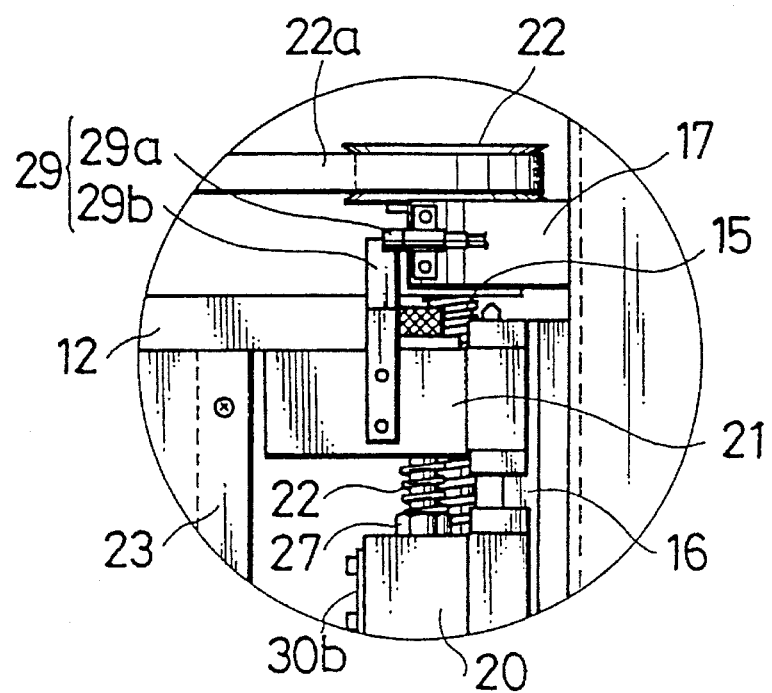
FIG. 6 is an enlarged front view of the encircled part "B" in FIG. 3.
Figure 7:
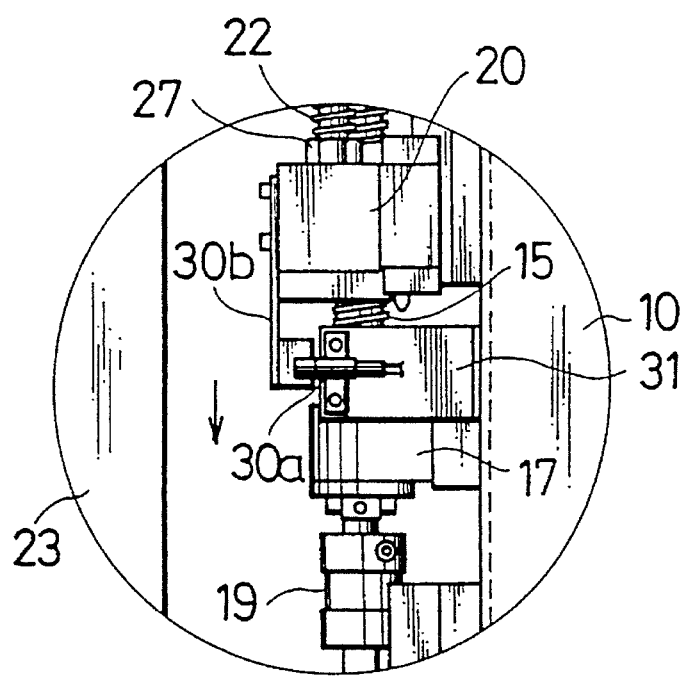
FIG. 7 is an enlarged front view of the encircled part "C" in FIG. 3.

The right stretch controller 25 (encircled part B in FIG. 3) is equipped with detection means 29 for setting the upper-limited positions of the movable, lateral beam and the movable clamp 14. As shown in FIG. 6, it comprises an upper-limited position detecting sensor 29a fixed to the upper bearing 17 and a sensing plate 29b rising up from the guide block 21. When the sensor 29a detects appearance of the upper edge of the sensing plate 29b, the control means prevents the movable, lateral beam 12 and the clamp 14 from rising further. 20 There is another detection means 30 in the vicinity of the lower end of the right threaded rod (encircled part C in FIG. 3) for setting the lower-limited position of the movable clamp 14. As best seen from FIG. 7, a lower-limited position detecting sensor 30a is fixed to a bracket 31 projecting from the pole 10 in the vicinity of the lower part of the left threaded rod 15. A sensing plate 30b suspending from the drive block 20 descends as the drive block 20 descends, and when the sensor 30a detects appearance of the lower edge of the sensing plate 30b, the control means prevents the movable clamp 14 from descending further.

Thus, the controlled rotation of the servo motor 18 causes the movable clamp 14 to rise and descend in agreement with the printed circuit board size, and the coiled spring 22 applies a desired stretch to the printed circuit board P to unbend the same while required testings are effected.

Figure 8:
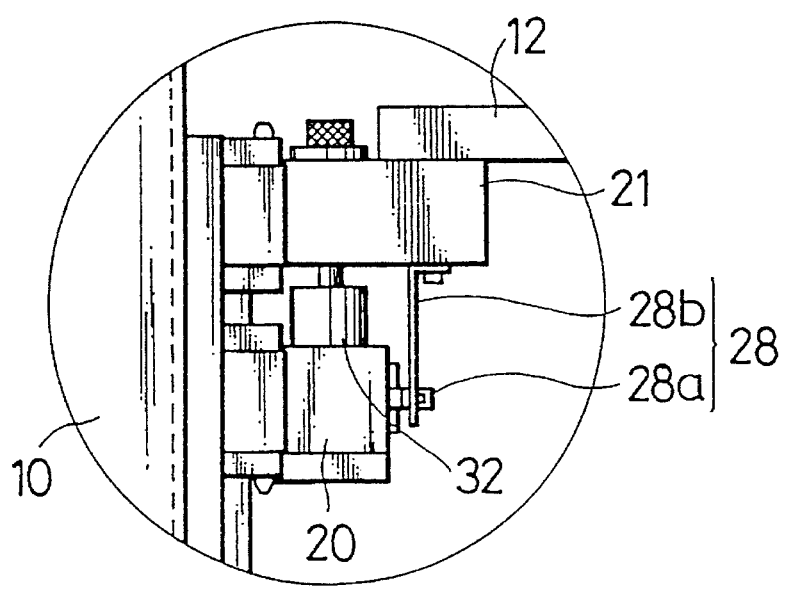
FIG. 8 is an enlarged front view of another example of the encircled part "A" in FIG. 3.

In this particular embodiment coiled springs are compressed to produce a stretch to be applied to a printed circuit board. The stretch controller and associated parts may be so designed as to pull coiled springs for producing a stretch to be applied to a printed circuit board. In place of springs air cylinders 32 may be used to produce a required stretch, as seen from FIG. 8.

Figure 9:
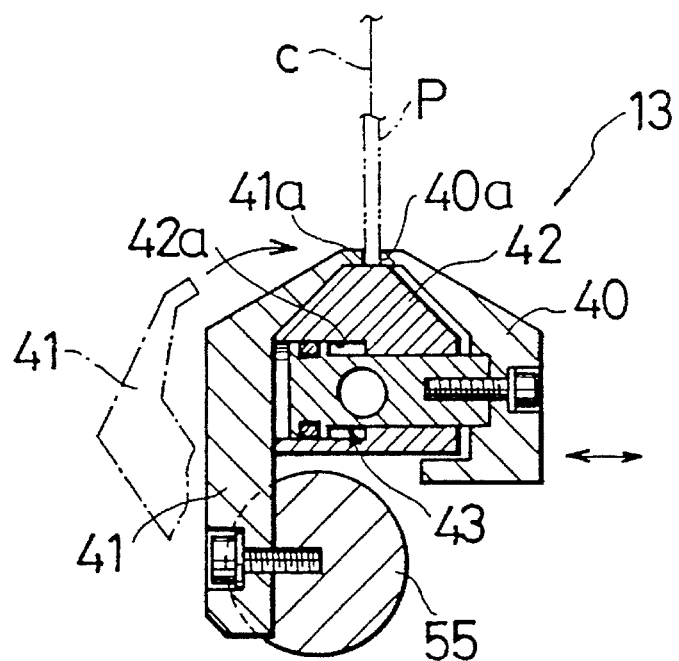
FIG. 9 is a longitudinal section showing the inner structure of the clamp in the printed circuit board holder.
Figure 10:
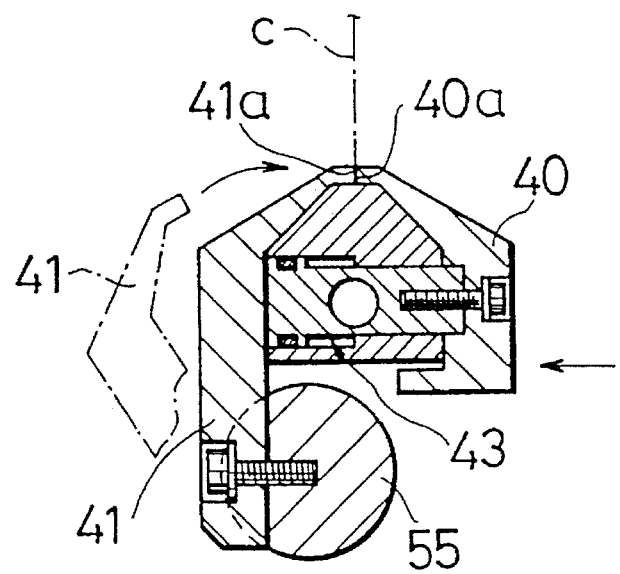
FIG. 10 is a similar longitudinal section showing the manner in which the stationary nail is adjustably shifted to permit the opposite gripping surfaces of the stationary and movable nails to abut on each other.
Figure 12:
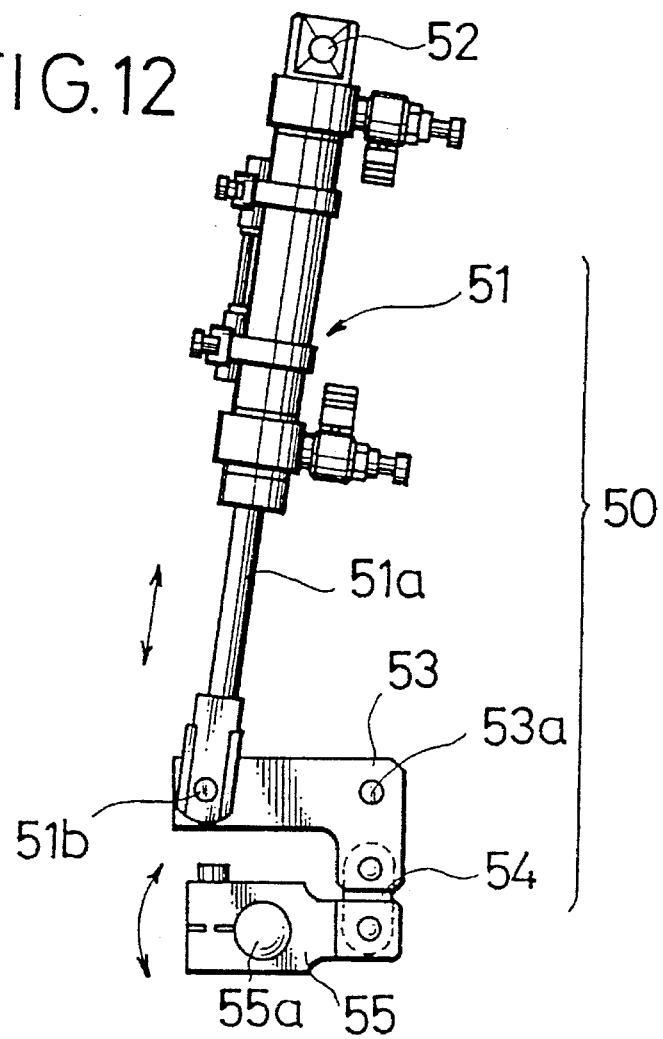
FIG. 12 is a side view of the clamp drive.

As seen from FIG. 9, each clamp 13, 14 comprises a stationary nail 40 and a movable nail 41, which can be rotated by a clamp drive 50 having an air cylinder 51 as driving source, as later described with reference to FIG. 12.

Figure 11:
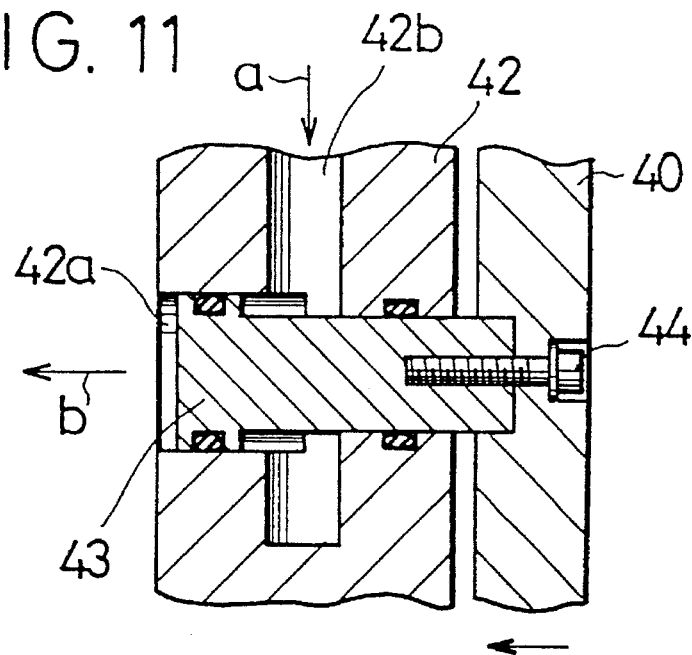
FIG. 11 is an enlarged longitudinal section of the air cylinder of the clamp.

The stationary nail 40 is designed to be adjustably shifted to meet the thickness of a selected printed circuit board P. As seen from FIG. 11, a clamp base 42 between the stationary nail 40 and the movable nail 41 has a piston 43 slidably fitted in its cylindrical hole 42a, and bolted to the stationary nail 40. An air channel 42b is made to communicate to the cylindrical hole 42a, thereby allowing air from an air pump (not shown) to flow in the cylinder hole 42a as indicated by arrow "a". Thus, the piston 43 is moved in the direction as indicated by arrow "b", and accordingly the stationary nail 40 is moved in the same direction.

As shown in FIG. 3, the movable nails 41 of the upper and lower clamps 14 and 13 are designed to be rotated by associated clamp drives 50, 50, which are fixed to support brackets 11a and 12a. As shown in FIG. 12, an air cylinder 51 is swingably fixed to a stationary support rod 52, and an L-shaped link 53 is rotatable about its stationary pivot 53a. One end of the L-shaped link 53 is rotatably fixed to the tip end of the piston rod 51a of the air cylinder 51 by a connecting pin 51b, and the other end of the L-shaped link 53 is rotatably fixed to a clamp axle gripping piece 55 via a small link 54. The clamp axle gripping piece 55 grips fixedly the clamp axle 55a of each clamp.

With this arrangement the air cylinder 51 is supplied with compressed air to rotate the L-shaped link 53 about its pivot 53a, accordingly rotating the clamp axle 55a and at the same time rotating the associated rotatable nail 41 to sandwich one lateral edge of the printed circuit board P between the movable, nail 41 and the stationary nail 40.

In gripping and holding a selected printed circuit board P with such clamps 13 and 14, the stationary nail 40 of each clamp is withdrawn, and the movable nail 41 is rotated apart from the stationary hall 40. Then, the printed circuit board P is put on the clamp base 42, and the movable nail 41 is rotated in the direction indicated by arrow until its gripping plane 41 has reached a reference position c, and then the movable nail 41 is locked at the reference position c.

Air is supplied into the cylinder 42a via the air channel 42b to drive the piston 43 and hence the stationary nail 40 toward the printed circuit board P until the printed circuit board P has been sandwiched between the gripping plane 41a of the movable nail 41 and the gripping plane 40a of the stationary nail 40. Then, a stretching force is applied to the printed circuit board P in the vertical "Y"-direction to unbend the same.

Figure 13:
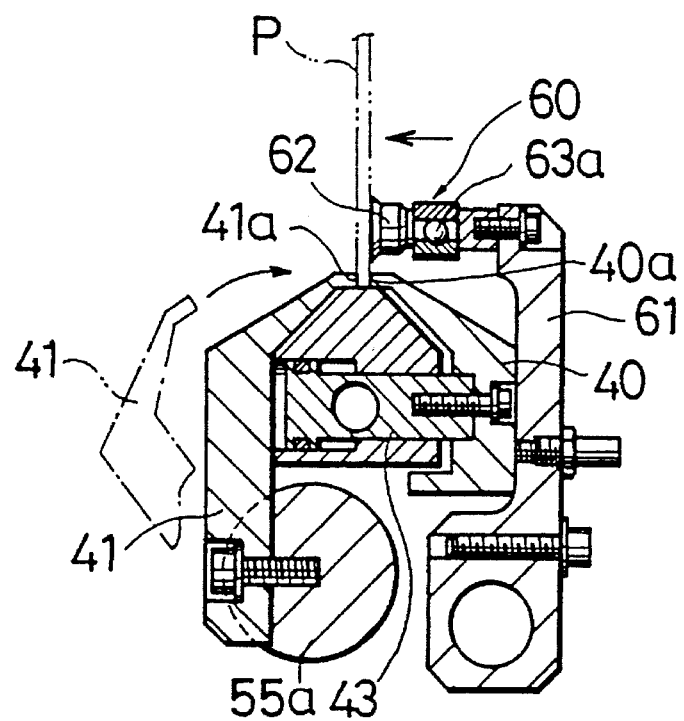
FIG. 13 is a longitudinal section of another example of clamp.
Figure 14:
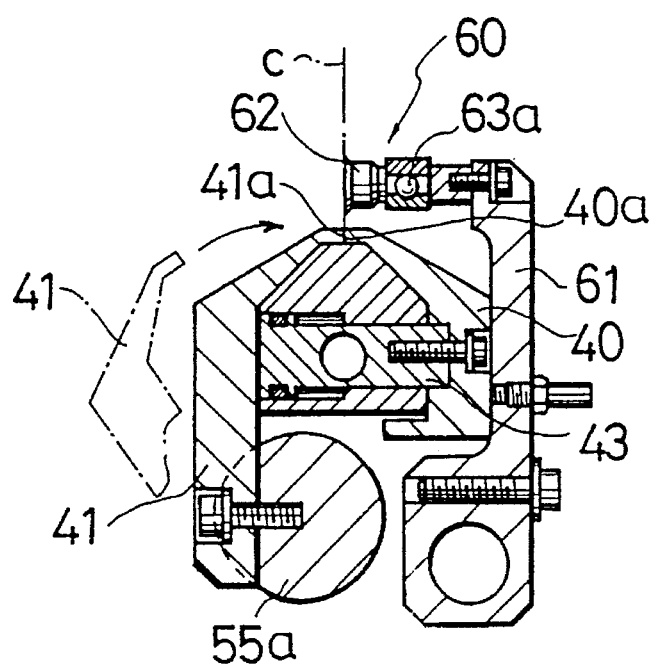
FIG. 14 is a similar longitudinal section showing the manner in which the stationary nail is adjustably shifted to permit the opposite gripping surfaces of the stationary and movable nails to abut on each other.

FIGS. 13 and 14 show another example of clamp, which is equipped with extra holding means 60. It comprises a support arm 61 integrally connected to the stationary nail 40 and a sucking pad 62 with a negative pressure sensor. As seen from FIG. 14, the sucking pad 62 is attached to the support arm 61, lying in the coextensive relation with the gripping plane 40a of the stationary nail 40. The sucking pad 62 has a vent 63a, which permits the drawing of air to a vacuum unit (not shown) to apply a negative pressure to the printed circuit board P.

In gripping and holding a selected printed circuit board P with such clamps each having the sucking pad 62, the stationary nail 40 of each clamp is withdrawn, and the movable nail 41 is rotated apart from the stationary nail 40. Then, the printed circuit board P is put on the clamp base 42, and the sucking pad 62 is attached to the printed circuit board P by applying a negative pressure thereto. The movable nail 41 is rotated until its gripping plane 41a has reached a reference position c, and the movable nail 41 is locked at the reference position c. Air is supplied from an air pump to the cylinder hole 42a, to move the stationary nail 40 while the printed circuit board P is kept sucked and held by the sucking pad 62 until the printed circuit board P has been sandwiched between the gripping plane 41a of the movable nail 41 and the gripping plane 40a of the stationary nail 40.

The negative pressure sensor is responsive to variation if any, in the negative pressure applied to the printed circuit board P which variation may be caused by the inadequate setting of the printed circuit board or the failure of gripping the printed circuit board for warning a person of such defective condition.

We claim:

1. Method of testing printed circuit board comprising steps of: holding a printed circuit board (P) longitudinally by gripping the opposite edges with two grippers (13, 14); applying a stretch to that portion of the printed circuit board disposed between the two grippers to unbend the printed circuit board; and conducting a desired test on the printed circuit board by moving at least one measuring probe (3) in longitudinal and lateral directions with each surface of the printed circuit board.

2. Printed circuit board tester comprising: a printed circuit board holder (2) for fixing and holding a printed circuit board (P) at a reference position; and at least one measuring probe (3) movable in longitudinal and lateral directions with each surface of the printed circuit board which is held at the reference position, said measuring probe (3) being capable of moving to a selected measuring point on the circuit board to test if there is any break in the circuit of the board; if there are necessary parts in the board; or if such parts function well, characterized in that: said holder (2) has a pair of clamps (13, 14) for gripping the opposite lateral edges of the printed circuit board holding longitudinally; drive means for driving the clamps close to or apart from each other; and stretch control means (25) between the drive means and one of the clamps for applying a controlled stretch to the printed circuit board.

3. Printed circuit board tester according to claim 2, wherein the stretch control means (25) has means for detecting inadequate gripping (29, 30) of the printed circuit board with the clamps (13, 14).

4. Printed circuit board tester according to claim 3, wherein the pair of clamps (13, 14) are arranged in the opposing relation, the upper clamp (14) being fixed to a movable lateral beam (12) which is adapted to move longitudinally by the drive means.

5. Printed circuit board tester according to claim 4, wherein the drive means comprises: a pair of longitudinal threaded rods (15); a pair of guide rails (16) each extending parallel to the associated longitudinal threaded rod; a servo motor (18) operatively connected to one of the longitudinal threaded rods; rotary transmission means (22a, 22b) for rotating the pair of longitudinal threaded rods in unison; and drive blocks (20) slidably fixed to the guide rails for moving up and down, the stretch control means (25) being provided between each drive means and the movable, lateral beam (12).

6. Printed circuit board tester according to claim 5, wherein the stretch control means (25) is positioned at each end of the movable lateral beam (12), and the stretch control means comprises a coiled spring (22) positioned between the drive block (20) and a guide block (21) provided slidably along the guide rail (16) and an adjusting bolt (26) for permitting adjusting of the distance between the guide block and the drive block.

7. Printed circuit board tester according to claim 2, wherein each clamp (13, 14) has a pair of nails (40, 41) for gripping one or the other lateral edge of the printed circuit board, one of these nails being adjustably movable in the direction of printed circuit board thickness, thereby permitting application of a predetermined pushing force to the printed circuit board regardless of the thickness of the printed circuit board.

8. Printed circuit board tester according to claim 7, wherein each clamp (13, 14) has means for applying a negative pressure (62) to the printed circuit board for holding the same, a plane of said negative pressure applying means being placed coextensive with the gripping plane of the nail (41) movable in the direction of the printed circuit board thickness.

* * * * *

UNITED STATES PATENT AND TRADEMARK OFFICE
CERTIFICATE OF CORRECTION

PATENT NO. : 5,461,323
DATED : October 24, 1995
INVENTOR(S) : K. Yanagi, et. al.

It is certified that error appears in the above-indentified patent and that said Letters Patent is hereby corrected as shown below:

Title page, item [73], Assingee: line 1, change "kangawa" to read -- Kanagawa--.

Signed and Sealed this

Twelfth Day of March, 1996

*Attest:*

BRUCE LEHMAN

*Attesting Officer*      *Commissioner of Patents and Trademarks*